(12) United States Patent
Liu et al.

(10) Patent No.: US 10,685,781 B2
(45) Date of Patent: Jun. 16, 2020

(54) SYNTHESIS OF TETRATAENITE THIN FILMS VIA RAPID THERMAL ANNEALING

(71) Applicant: THE REGENTS OF THE UNIVERSITY OF CALIFORNIA, Oakland, CA (US)

(72) Inventors: Kai Liu, Davis, CA (US); Julius De Rojas, Davis, CA (US); Dustin A. Gilbert, Germantown, MD (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 16/203,933

(22) Filed: Nov. 29, 2018

(65) Prior Publication Data

US 2019/0180933 A1 Jun. 13, 2019

Related U.S. Application Data

(63) Continuation of application No. PCT/US2017/035255, filed on May 31, 2017.
(Continued)

(51) Int. Cl.
*H01F 41/22* (2006.01)
*C23C 14/58* (2006.01)
(Continued)

(52) U.S. Cl.
CPC .......... *H01F 41/22* (2013.01); *B32B 15/015* (2013.01); *C23C 14/165* (2013.01);
(Continued)

(58) Field of Classification Search
CPC ... H01F 41/22; H01F 1/14716; B32B 15/015; B32B 2307/208
(Continued)

(56) References Cited

U.S. PATENT DOCUMENTS 5,800,931 A * 9/1998 Lee .......................... G11B 5/66
428/611
2013/0186238 A1 7/2013 Hayashi
(Continued)

FOREIGN PATENT DOCUMENTS

WO 2012141205 A2 10/2012
WO WO-2015053006 A1 * 4/2015 ............... C30B 1/04
(Continued)

OTHER PUBLICATIONS

Hsiao, S. N., et al. "Direct evidence for stress-induced (001) anisotropy of rapid-annealed FePt thin films." Applied Physics Letters 100.26 (2012): 261909 (Year: 2012).*
(Continued)

*Primary Examiner* — Anthony J Zimmer
*Assistant Examiner* — Ricardo D Morales
(74) *Attorney, Agent, or Firm* — O'Banion & Ritchey LLP; John P. O'Banion (57) ABSTRACT

A method for synthesis of high anisotropy $L1_0$ FeNi (tetrataenite) thin films is provided that combines physical vapor deposition via atomic layer sputtering and rapid thermal annealing with extreme heating and cooling speeds. The methods can induce $L1_0$-ordering in FeNi thin films. The process uses a base composite film of a support substrate, a seed layer, a multilayer thin film of FeNi with alternating single atomic layers of Fe and Ni that mimics the atomic plane of the final $L1_0$ FeNi alloy, and a capping layer. The Fe and Ni bilayers are grown on top of a Si substrate with a thermally oxidized $SiO_2$ seed layer to mechanically strain the sample during rapid thermal annealing.

24 Claims, 5 Drawing Sheets

Related U.S. Application Data (60) Provisional application No. 62/343,531, filed on May 31, 2016.

(51) Int. Cl.
*C23C 14/16* (2006.01)
*B32B 15/01* (2006.01)
*H01F 1/147* (2006.01)

(52) U.S. Cl.
CPC ..... *C23C 14/5806* (2013.01); *H01F 1/14716* (2013.01); *B32B 2307/208* (2013.01)

(58) Field of Classification Search
USPC .......................................... 148/105
See application file for complete search history.

(56) References Cited

U.S. PATENT DOCUMENTS

| | | | | |
|---|---|---|---|---|
| 2014/0252515 A1* | 9/2014 | Lai | ........................... | H01L 43/12 257/421 |
| 2015/0008547 A1* | 1/2015 | Pi | ............................ | H01L 43/04 257/421 |

FOREIGN PATENT DOCUMENTS

| | | |
|---|---|---|
| WO | 2016036856 A1 | 3/2016 |
| WO | 2017210324 A1 | 12/2017 |

OTHER PUBLICATIONS

Mahalingam, T., et al. "Microstructure and magnetic properties of sputtered Fe—Pt thin films." Journal of Physics: Condensed Matter 15. 17 (2003): 2561 (Year: 2003).*

Boulouz, M., et al. "Influence of substrate temperature and target composition on the properties of yttria-stabilized zirconia thin films grown by RF reactive magnetron sputtering." Thin Solid Films 323. 1-2 (1998): 85-92 (Year: 1998).*

Swann, S. "Magnetron sputtering." Physics in technology 19.2 (1988): 67 (Year: 1988).*

Kojima, Takayuki, et al. "Magnetic anisotropy and chemical order of artificially synthesized L10-ordered FeNi films on Au—Cu—Ni buffer layers." Japanese Journal of Applied Physics51.1R (2011): 010204. (Year: 2011).*

WO-2015053006-A1 Translation (Year: 2015).*

ISA/KR, Korean Intellectual Property Office (KIPO), International Search Report and Written Opinion dated Aug. 18, 2017, related PCT international application No. PCT/US2017/035255, pp. 1-13, claims searched, pp. 14-18.

Gilbert, Dustin A. et al., "Tuning magnetic anisotropy in (001) oriented L10 (Fe1-xCux)55Pt45 films", Applied Physics letters 102, 132406 (2013), published online Apr. 2, 2013, 4 pages.

Gilbert, Dustin A. et al., "Probing the A1 to L10 transformation in FeCuPt using the first order reversal curve method", APL Materials 2, 086106 (2014), published online Aug. 28, 2014, 8 pages.

Kojima, T. et al., "L10-ordered FeNi film grown on Cu—Ni binary buffer layer", 2nd Int. Symp. on Advanced Magnetic Materials and Applications (ISAMMA 2010), Journal of Physics: Conference Series 266 (2011) 012119, 5 pages.

Neel, L. et al., "Magnetic Properties of an Iron-Nickel Single Crystal Ordered by Neutron Bombardment", Journal of Applied Physics, vol. 35, No. 3 (Two Parts—Part 2), Mar. 1964, pp. 873-876.

Shima, T. et al., "Low-temperature fabrication of L10 ordered FePt alloy by alternate monatomic layer deposition", Applied Physics Letters, vol. 80, No. 2, Jan. 14, 2002, pp. 288-290.

Shima, T. et al., "Structure and magnetic properties for L10-ordered FeNi films prepared by alternate monatomic layer deposition", Journal of Magnetism and Magnetic Materials 310 (2007) 2213-2214, published online Nov. 17, 2006.

Tashiro, T. Y. et al., "Structural and magnetic properties of FeNi thin films fabricated on amorphous substrates", Journal of Applied Physics 117, 17E309 (2015), publshed online Mar. 6, 2015, 3 pages.

Wang, Liang-Wei et al., "Promotion of [001]-oriented L10-FePt by rapid thermal annealing with light absorption layer", Applied Physics Letters 101 252403 (2012), published online Dec. 17, 2012, 4 pages.

* cited by examiner

FIG. 5

SYNTHESIS OF TETRATAENITE THIN FILMS VIA RAPID THERMAL ANNEALING

CROSS-REFERENCE TO RELATED APPLICATIONS

This application claims priority to, and is a 35 U.S.C. § 111(a) continuation of, PCT international application number PCT/US2017/035255 filed on May 31, 2017, incorporated herein by reference in its entirety, which claims priority to, and the benefit of, U.S. provisional patent application Ser. No. 62/343,531 filed on May 31, 2016, incorporated herein by reference in its entirety. Priority is claimed to each of the foregoing applications.

The above-referenced PCT international application was published as PCT International Publication No. WO 2017/210324 A1 on Dec. 7, 2017, which publication is incorporated herein by reference in its entirety.

STATEMENT REGARDING FEDERALLY SPONSORED RESEARCH OR DEVELOPMENT

This invention was made with Government support under Grant Nos. DMR1008791 and ECCS1232275, awarded by the National Science Foundation. The Government has certain rights in the invention.

BACKGROUND

1. Technical Field

The technology of this disclosure pertains generally to magnetic materials and fabrication methods, and more particularly methods for the synthesis of $L1_0$ FeNi (tetrataenite) thin films that combines physical vapor deposition via atomic layer sputtering and rapid thermal annealing (RTA) with extreme heating and cooling speeds. The method described herein adapts the RTA approach on a strained Si wafer to induce a phase transformation in FeNi thin films.

2. Background Discussion

High magnetic anisotropy ($K_U$) materials are particularly useful in device applications such as high energy density permanent magnets, information storage including ultrahigh density heat-assisted magnetic recording (HAMR) media, magnetic memory and logic devices, and other spintronic devices. Permanent magnets find uses in hybrid/electric vehicles, magnetically levitated trains, wind turbines, power storage, consumer electronics, magnetic refrigeration, etc.

However, leading materials for permanent magnet applications are all rare-earth-based, such as NdFeB and SmCo. The rare-earth elements in these devices are critical materials with prices that have seen wild fluctuations over recent years.

A leading candidate for heat-assisted magnetic recording media applications is an FePt alloy in the face-centered tetragonal $L1_0$ phase, as it exhibits large anisotropy constant ($K_U$) values (up to $7 \times 10^7$ erg/cm$^3$), a large saturation magnetization Ms of ~1100 emu/cm$^3$, and a moderate Curie temperature $T_C$ of 750 K. Other related high anisotropy $L1_0$ materials include CoPt, CoPd and FePd. Unfortunately, these alloys are also exceedingly expensive, as they make use of costly noble metals such as Pt and Pd.

Therefore, there is a need for high magnetic anisotropy materials that are rare-earth-free and precious-metal-free.

One material of particular interest containing only earth-abundant elements is a chemically ordered $L1_0$-type alloy of FeNi known as tetrataenite. This structure has been observed and studied since the 1960's and has been shown to have unique magnetic properties that are different from conventional Fe—Ni alloys. Common FeNi alloys such as permalloy ($Fe_{19}Ni_{81}$) are magnetically very soft (i.e. weak anisotropy), and are unsuitable for magnetic recording media and permanent magnet applications.

The $L1_0$ ordered FeNi has been shown to exhibit a large magneto-crystalline anisotropy (MCA, up to ~$1 \times 10^7$ erg cm$^{-3}$). This material does not contain any noble metals. The high Curie temperature and corrosion resistance of the material makes it a very attractive choice for practical applications in both magnetic recording and permanent magnets.

Although alloys of FeNi can form a metastable high anisotropy $L1_0$ phase, scalable methods of producing this $L1_0$ phase have remained elusive. Previous studies have shown that $L1_0$-FeNi can be produced in a laboratory setting by use of neutron bombardment of a bulk polycrystalline samples at high temperatures, which is impractical for device fabrication.

FeNi changes crystallographic structure from the face-centered-cubic (fcc) phase to the ordered, $L1_0$ tetragonal phase, with the latter being an equilibrium phase below 320° C. The $L1_0$ phase of FeNi has been observed to have a face-centered-tetragonal (fct) lattice, with chemical order in the form of alternating atomic layers of Fe and Ni along the c-axis. Phase transitions between the fcc phase and the desired fct phase have been estimated to require extremely slow cooling rates ($10^{-9}$ K/year) due to the extremely low diffusion rates for Ni. Consequently, the creation of practical fabrication schemes for $L1_0$-FeNi has been problematic.

Accordingly, there is a need for methods of fabrication of high magnetic anisotropy ($K_U$) materials that are rare-earth-free and precious-metal-free for use in emerging ultrahigh density heat-assisted magnetic recording technologies and high energy density permanent magnets.

BRIEF SUMMARY

The present technology provides a method for synthesis of $L1_0$ FeNi (tetrataenite) thin films that combines physical vapor deposition via atomic layer sputtering and rapid thermal annealing (RTA) with extreme heating and cooling speeds. The methods can induce $L1_0$-ordering in FeNi films. The approach utilizes the strained Si wafer to induce a phase transformation in FeNi thin films.

The preferred material that is produced only contains earth-abundant common elements avoiding the costs and difficulties associated with the use of rare earth elements. Generally, the approach is to grow FeNi thin films composed of alternating Fe and Ni monolayers in the cubic A1 phase first, on top of a silicon substrate with a thermally oxidized silicon oxide seed layer. In order to induce the tetragonal $L1_0$ ordering, the sample is mechanically strained via a very abrupt exposure to a high temperature heating element, then removed from exposure and evacuated, and subsequently the substrate is quickly cooled to room temperature. This approach leads to stable $L1_0$ FeNi films with substantially higher anisotropy than the cubic A1 phase.

The base composite for the process has a support substrate, oxide layer and a multilayer thin film of FeNi with alternating single atomic layers of Fe and Ni that mimics the atomic plane of the final $L1_0$ FeNi alloy, and a capping layer. The Fe and Ni bilayers are grown on top of a Si substrate with a thermally oxidized $SiO_2$ seed layer to mechanically strain the sample during rapid thermal annealing. Due to its small band gap of about 1 eV, the Si substrate readily absorbs the heating light and heats up. In contrast, the $SiO_2$ (up to a few hundred nm thick) has a much larger 9 eV band gap and does not absorb the heating light readily. The thin FeNi layers that are grown on top of $SiO_2$ are mainly heated through thermal conduction across the $SiO_2$ barrier, which is substantially slower than the Si substrate heating. As a result, the quick thermal expansion of the Si substrate exerts significant tensile stresses on the FeNi film across the $SiO_2$ layer and transfers the thermal energy to assist in the $L1_0$ ordering.

By way of example and not of limitation, a synthesis route to achieve high anisotropy FeNi in the $L1_0$ phase using RTA is provided. In one embodiment, the sample is heated up to 800° C. in a high vacuum chamber. In one embodiment, the sample is brought in from room temperature in the load-lock area of the high vacuum chamber extremely fast to the 800° C. region over a period of about 1-2 seconds. As a result, the as-grown FeNi films are heated at a rate up to 400° C./second, much faster than 40-50° C./second typically possible in conventional RTA systems. The sample is exposed directly to the heating region for 60-90 seconds. After the fast heating step, the substrate is then quickly extracted to the load-lock region over a period of less than 2 seconds and cooled to room temperature over the next few minutes. The fast cooling is important to preserve the $L1_0$ phase after its formation at high temperatures. The $L1_0$ FeNi phase is thus achieved via a "shock" approach over the course of less than 10 min, which is highly advantageous for practical applications. As a result, there is a substantial increase of coercivity by 1-2 orders of magnitude, which is an indicator of the magnetic anisotropy of the film. Accordingly, $L1_0$ FeNi is fabricated using a unique combination of synthesis steps.

Further aspects of the technology described herein will be brought out in the following portions of the specification, wherein the detailed description is for the purpose of fully disclosing preferred embodiments of the technology without placing limitations thereon.

BRIEF DESCRIPTION OF THE SEVERAL VIEWS OF THE DRAWINGS

The technology described herein will be more fully understood by reference to the following drawings which are for illustrative purposes only.

DETAILED DESCRIPTION

Referring more specifically to the drawings, for illustrative purposes, embodiments of methods for the synthesis of $L1_0$ FeNi (tetrataenite) thin films are generally shown. Several embodiments of the technology are described generally in FIG. 1 and FIG. 2 to illustrate the characteristics and functionality of the apparatus and system. It will be appreciated that the methods may vary as to the specific steps and sequence, and the systems and apparatus may vary as to structural details without departing from the basic concepts as disclosed herein. The method steps are merely exemplary of the order that these steps may occur. The steps may occur in any order that is desired, such that it still performs the goals of the claimed technology.

Generally, the synthesis of $L1_0$ FeNi thin films is used to illustrate the technology. Although the methods are demonstrated in the domain of FeNi thin films, the apparatus and methods can be adapted and applied to other alloyed materials, including CoPt, CoPd, FePd, etc.

Figure 1:
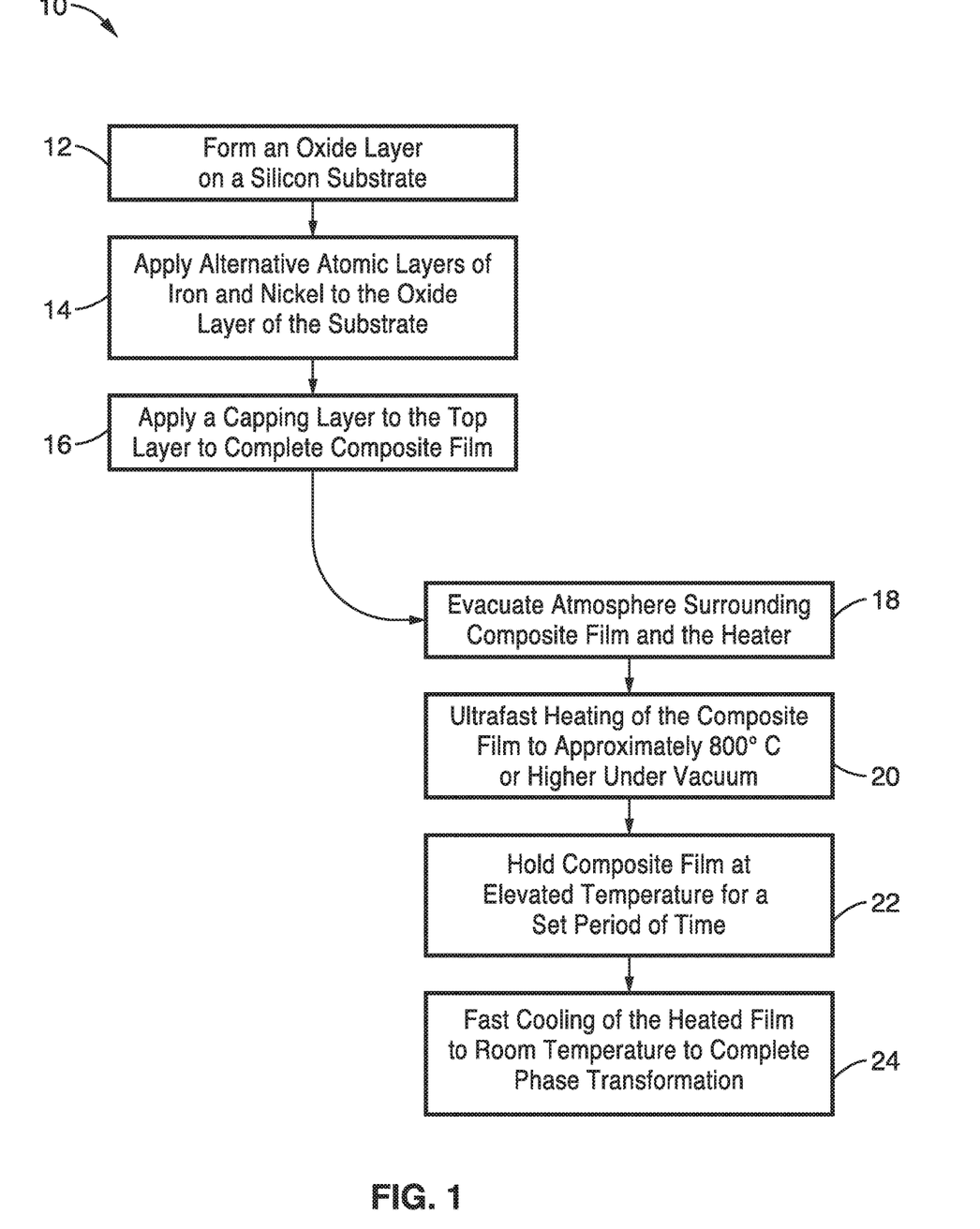
FIG. 1 is a functional block diagram of a method for fabricating $L1_0$ FeNi tetrataenite thin films according to one embodiment of the technology.

Turning now to FIG. 1, a flow diagram of one embodiment of a method 10 for the fabrication of $L1_0$ FeNi (tetrataenite) thin films is shown schematically. Initially, a starting composite film 24 is produced with a configuration such as that shown in FIG. 2 with the process steps of block 12 to block 16 of FIG. 1.

At block 12 a silicon oxide seed layer is formed on a base silicon substrate. In one embodiment, silicon wafers with (100) orientation are thermally treated in a heating furnace with oxygen, creating thin layers of $SiO_2$ (130 nm to 200 nm) on the Si surface. Other materials with a large enough band gap as compared to the heating energy, such as MgO, $Al_2O_3$, $HfO_2$, $Gd_2O_3$, and BN, may be used as the seed layer in block 12. Other substrates with a similar narrow band gap as Si, such as Ge, PbSe, PbS, InSb, $Bi_2Te_3$, alpha-Sn, SnTe, SnSe, and GaAs, may be used as the substrate at block 12.

Alternating atomic layers of Fe and Ni are then applied to the $SiO_2$ surface of the substrate at block 14 of FIG. 1. In one preferred embodiment, thin films of Fe and Ni are deposited using magnetron sputtering in an ultrahigh vacuum (UHV) chamber with a base pressure of approximately $2 \times 10^{-8}$ Torr. Sputter depositions may be performed with the substrate held at approximately 220° C., as measured by a thermocouple held at the substrate. The sputtering typically uses high purity Argon gas with a working pressure of 2 mTorr. Deposition rate may vary, and a representative rate is on the order of 0.01 nm/s. The preferred sputtering targets are elemental Fe and Ni targets with a purity of better than 99.95%. In one embodiment, one atomic layer of Fe is deposited first, followed by another atomic layer of Ni, and the Fe/Ni bilayer structure is repeated multiple times. In another embodiment, the Ni layer is deposited first.

It will be seen that any number of alternating metal bilayer repeats can be applied at block 14. In one preferred embodiment, the composite has repeated deposits within the range of one to approximately thirty bilayers of Fe/Ni. However, some composites can be thicker using as many as 1000 alternating atomic layers of Fe and Ni or the other selected materials.

The alternating monolayers of Fe and Ni are preferably in an approximately 50-50 ratio, mimicking the final atomic planes of the $L1_0$ FeNi. However, the Fe and Ni bilayers may have an atomic ratio of Fe to Ni within the range of approximately 30:70 to approximately 70:30.

The composite film may be capped at block 16 of FIG. 1 with a material that will protect the top surface of the composite. In one embodiment, a 1 nm Fe capping layer may be sputtered on top of the structure to prevent oxidation. The final composite can then be exposed to an atmosphere of Nitrogen gas, industrial grade 99.95%, for example.

Figure 2:
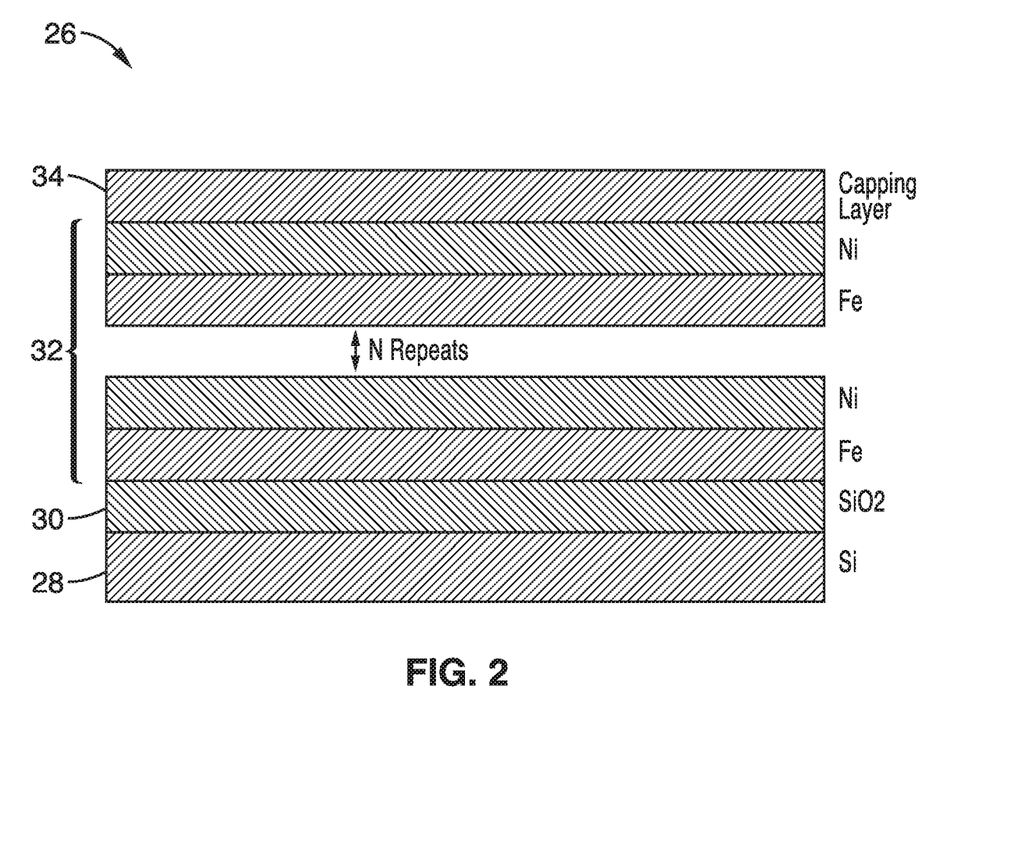
FIG. 2 is a schematic side view of a structure of the FeNi composite film prior to processing according to the steps of FIG. 1.

One preferred embodiment of the starting composite film 26 is shown schematically in cross-section in FIG. 2. The top surface of the Si substrate 28 has a $SiO_2$ layer 30 that serves as a seed layer for the alloy layer 32 formed from Fe/Ni bilayers. The typical thickness of the oxide layer 30 of the substrate 28 is about 130 nm. A layer of Fe is preferably the first layer applied to the oxide layer 30 on top of the substrate 28, and this Fe layer is then paired with a Ni layer. However, in other embodiments, the first layer of the Fe/Ni bilayer is Ni. The alloy layer 32 of the composite 26 can be formed by any number of Fe/Ni bilayers but typically from two to as many as a thousand repeats of the bilayers. Each of the atomic metal layers preferably has a thickness of approximately 2.7 to 2.8 angstroms.

In the embodiment shown in FIG. 2, N repeats of the Fe/Ni bilayers are used to form the alloy layer 32 of composite ending with a Ni layer. A capping layer 34, such as Fe, creates the top surface of the composite and completes the composite film 26. A capping layer 34 with a thickness of approximately 1 nm is normally suitable to protect the outer surface of the composite 26.

The starting composite film 26 is processed at the steps of blocks 18 to 24 of FIG. 1 to induce a phase transformation of parts of the composite film structure to $L1_0$-ordered FeNi tetrataenite thin films.

At the step of block 18 of FIG. 1, the composite film produced at block 16 is placed into a heating chamber that is preferably evacuated to remove the ambient air gases. In one embodiment, the chamber is evacuated to a base pressure of $2 \times 10^{-8}$ Torr, and the composite film is loaded into a load lock chamber adjacent to the heating chamber and evacuated to a pressure of below $1 \times 10^{-6}$ Torr.

Figure 3A:
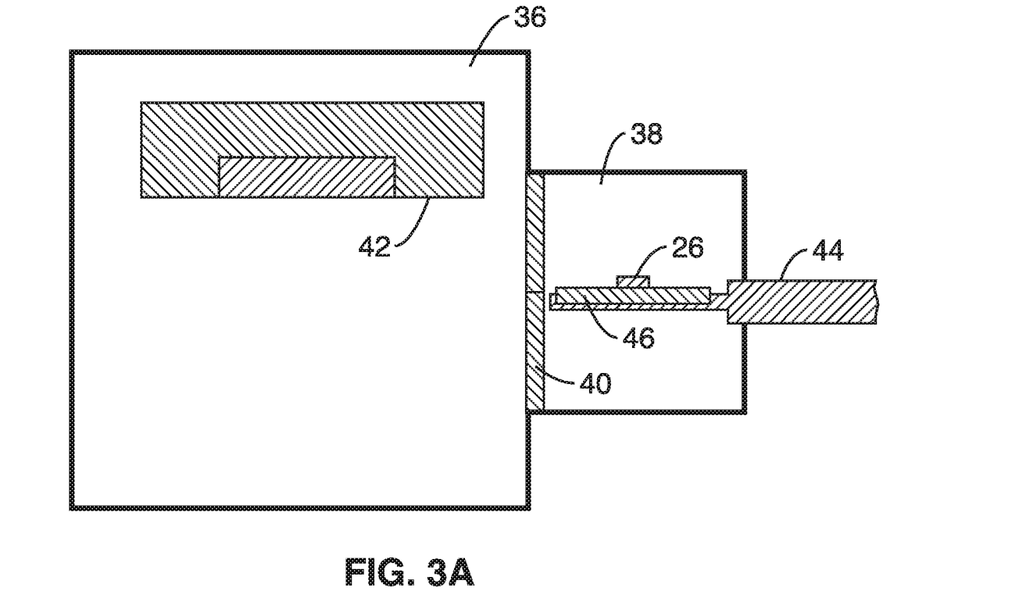
FIG. 3A is a schematic side view illustration of a heating apparatus with heating chamber, load lock chamber and transfer rod with the composite film positioned within the load lock prior to RTA processing.
Figure 3B:
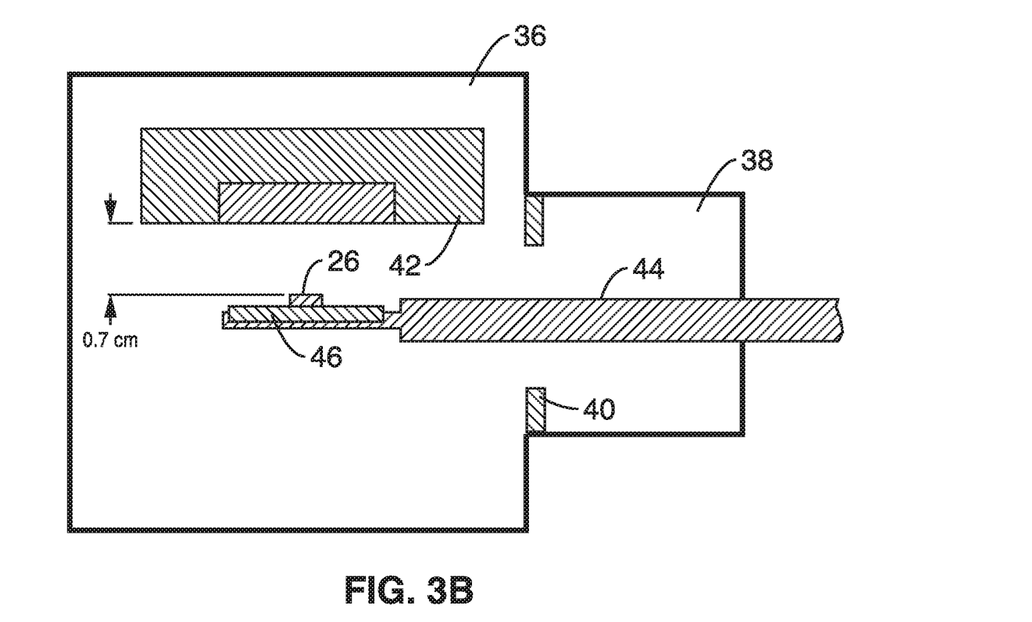
FIG. 3B is a schematic side view illustration of the heating apparatus of FIG. 3A with the composite film positioned within the heating chamber during RTA processing.

The temperature of the substrate heater is elevated to approximately 800° C. or above at block 20, as measured at the substrate heater window thermocouple. The sample initially sits in the adjacent load lock chamber at room temperature, with the load lock valve closed, as shown in FIG. 3A. The load lock is then opened and the sample is quickly transferred from room temperature into a position in the heating zone, usually over a period of 1 to 2 seconds, at a distance of 0.7 cm below the substrate heater 42, as shown in FIG. 3B.

Accordingly, this process rapidly heats up the composite FeNi films 26 at a rate up to 400° C./second, which is much faster than the maximum heating rate of 40-50° C./second that is typically possible in conventional RTA systems. The preferred rate of this ultrafast heating of the composite film at block 20 is within the range of approximately 100° C./second to approximately 2000° C./second.

At block 22, the sample is preferably exposed directly to the heater at 800° C. or above for a period of time. The time of exposure at block 22 is preferably between approximately 10 seconds to approximately 10,000 seconds and more preferably between approximately 60 to approximately 90 seconds.

Once heating is completed, the film is then immediately transferred out of the heat bath and moved into a transfer load lock at room temperature at block 24. This process again typically takes less than 1000 seconds takes and often takes only 1 to 2 seconds. The load lock may then be immediately evacuated with >99.95% pure Nitrogen. Once the load lock reaches 1 atmosphere, in 1-2 minutes, the sample is immediately removed from the sample platter (which is still very warm) and placed in contact with a thermal sink such as another metal platform to quickly bring the sample substrate to room temperature. The rapid heating and cooling cycle is important to achieve the $L1_0$ FeNi phase, usually over the course of less than 10 minutes.

Figure 4:
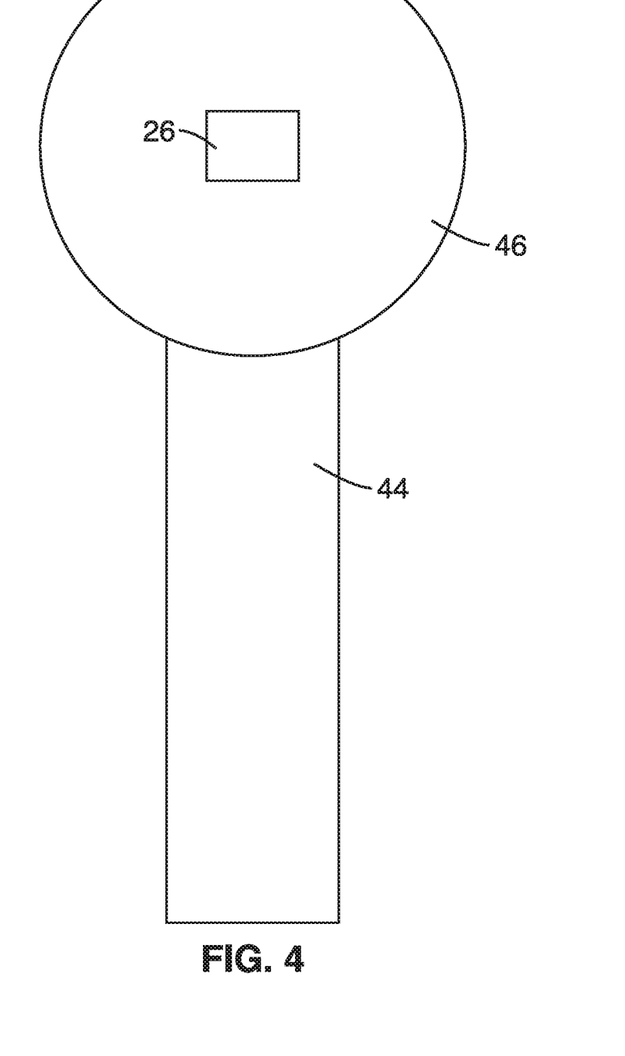
FIG. 4 is a schematic top view illustration of the transfer arm with sample platter and the composite film on the sample platter.
Figure 5:
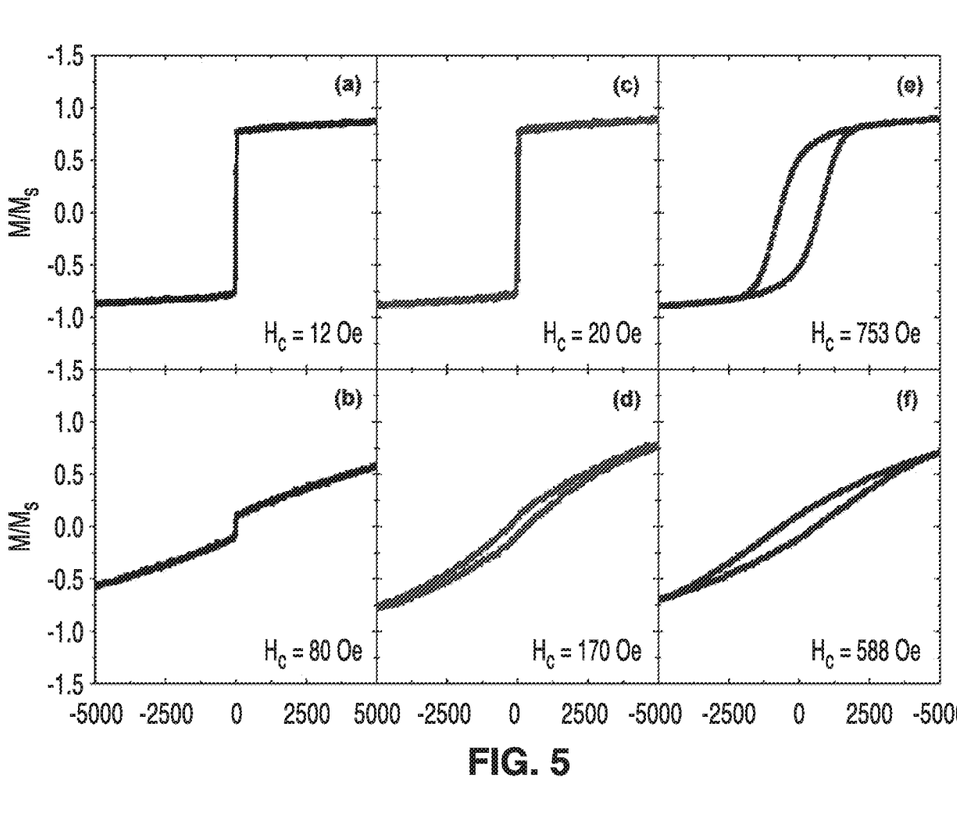
FIG. 5 are graphs of Magnetic hysteresis loops measured in the in-plane geometry (top) and the out-of-plane geometry (bottom) for FeNi films (a,b) sputtered at room temperature, (c,d) sputtered at 220° C., and (e,f) sputtered at 220° C. and followed by RTA at 800° C. for 90 seconds.

One heating apparatus embodiment is depicted schematically in the side views of FIG. 3A and FIG. 3B as well as in the top view of the transfer arm of FIG. 4 to illustrate the structure and methods.

The apparatus shown in FIG. 3A and FIG. 3B has a heating chamber 36, such as a UHV chamber, that is attached to a load lock chamber 38 and separated by a load lock valve 40 that opens to the interior of the heating chamber 36. The load lock valve 40 is closed in FIG. 3A and open in FIG. 3B with the transfer rod 44 and sample platter 46 extended into the heating chamber 36 through the load lock valve 40.

As shown in FIG. 4, one or more composite films 26 can be placed on a sample platter 46 and secured. For example, the sample 26 can sit on the back of the sample platter 46 and be held in place with a simple clip. The sample platter 46 is coupled to the transfer rod 44.

The sample platter 46 and transfer rod 44 allow the placement of the platter 42 into the load lock 38 and eventually into a heating chamber 36, directly below a substrate heater box 42 for rapid heating of the composite film 26 as shown in FIG. 3B. In this illustration, the sample 26 is initially placed in the load lock 38 with the transfer rod 44 and platter 46. At the appropriate time, the load lock valve 40 is opened and the sample 26 is properly positioned below the heater box 42 at a selected optimum distance (0.7 cm) as shown in FIG. 3B. Here, the composite FeNi films 26 are annealed through RTA in a UHV chamber 36 by substrate heating light bulbs (halogen lamps) to induce the phase transformation. The FeNi films 26 that are made with the process shown in FIG. 1 exhibit properties that are consistent with the expected $L1_0$ FeNi structure.

The technology described herein may be better understood with reference to the accompanying examples, which are intended for purposes of illustration only and should not be construed as in any sense limiting the scope of the technology described herein as defined in the claims appended hereto.

Example 1

In order to demonstrate the operational principles of the apparatus and synthesis methods, FeNi composite films were produced and processed using the processing steps shown generally in FIG. 1. Four material samples were prepared for evaluation as follows:
Sample A: sputtered at room temperature;
Sample B: sputtered at 220° C.;
Sample C: sputtered at 220° C., followed by RTA at 800° C. for 60 s;
Sample D: sputtered at 220° C., followed by RTA at 800° C. for 90 s.

Magnetic measurements were performed at room temperature using a PMC Corp. Model 3900 vibrating sample magnetometer (VSM) and a Quantum Designs superconducting quantum interference device (SQUID) magnetometer, with applied magnetic field both in the plane and perpendicular to the film plane. Graphs of magnetic hysteresis loops measured in the in-plane geometry (top) and the out-of-plane geometry (bottom) for Sample A, Sample B and Sample D for comparison are shown in FIG. 6.

Magnetic hysteresis loops for the Sample FeNi thin films were measured before and after the RTA process, for each deposition temperature and RTA processing time, as shown in FIG. 6. Sample A showed a square hysteresis loop with a small coercivity of 12 Oe in plane [FIG. 6(a)], and a slanted loop with a coercivity of 80 Oe out-of-plane [FIG. 6(b)], respectively. This is consistent with a disordered cubic A1 FeNi phase with an in-plane magnetic easy axis.

Sample B exhibited a similar hysteresis loop with a coercivity of 20 Oe in plane [FIG. 6(c)] and 170 Oe out of plane [FIG. 6(d)], indicating an enhancement of its anisotropy compared with Sample A.

In Sample C, the coercivity increased to 430 Oe in-plane and 420 Oe out-of-plane (not shown) as a result of the application of rapid thermal annealing processing steps. The processing steps and longer exposure (RTA treatment for 90 s at 800° C.) of Sample D produced even more dramatic results. The coercivity exhibited the greatest increase, up to 753 Oe in-plane [a 63-fold increase, FIG. 6(e)] and 588 Oe out-of-plane [FIG. 6(f)]. These substantial changes in the coercivity, by 1-2 orders of magnitude, suggest that the RTA process is promoting chemical ordering of the FeNi via heating and tensile stress across the boundary. From the hysteresis loops shown in FIG. 6, it is clear that the magnetic easy axis of the samples remain in-plane, indicating that the c-axis of the $L1_0$ phase may be oriented in the film plane.

Example 2

To better understand the microstructure of the samples, TEM studies and electron diffraction were performed on each sample. For Sample A, plan-view TEM showed small, polycrystalline grains which corresponded to the electron diffraction patterns that exhibited several peaks (rings) associated with a polycrystalline fcc phase. A similar effect was observed in Sample B.

For Sample C and Sample D, sizable ordered crystalline regions were clearly visible in TEM images. The corresponding electron diffraction patterns exhibited discrete spots along the rings, consistent with improved crystallinity. The observed straining in the lattice was consistent with a transformation from a fcc phase in samples A and B to a fct phase in samples C and D with a larger c lattice parameter. Furthermore, morphology analysis carried out by scanning electron microscopy confirms that the annealed samples retain the continuous film structure, in contrast to the presence of voids seen in similarly processed films.

To quantitatively assess the degree of $L1_0$ ordering, the magnetic anisotropy constant was measured by evaluating the hard axis saturation field ($H_K$) in a hysteresis loop measured by SQUID. From the saturation field values and correcting for demagnetization, an anisotropy constant of $6\times10^6$ erg cm$^{-3}$ for Sample D was derived.

To further examine the degree of $L1_0$ ordering, a first-order reversal curves (FORC) method was used to qualitatively and quantitatively capture the A1 to $L1_0$ phase transition in FeNi. For the FORC measurements, the sample is first saturated by a positive magnetic field. The field is then swept to a reversal field, $H_R$, and the magnetization M(H, $H_R$) was measured as the field is increased back up to positive saturation. These set of points map out a reversal curve associated with a particular value of $H_R$. This was then repeated for a set of $H_R$ values, creating a family of FORC's.

The FORC distribution was then extracted. The extracted FORC distribution was then normalized to the measured saturation magnetization.

FORC distributions measured for Sample A and Sample D in the out-of-plane geometry were observed. For sample A, the FORC distribution showed only a peak near $H_C$=0, reflecting a magnetically soft phase with small coercivities. This is consistent with the chemically-disordered cubic A1 FeNi phase before the RTA processing. For sample D, the FORC distribution exhibited two distinct features: 1) a FORC ridge near $H_C$=0, much like Sample A, which indicated that some fraction of the disordered cubic phase still remained post RTA; and 2) a peak centered near $H_C$~1.2 kOe, indicative of a magnetically hard high coercivity phase. This high-coercivity phase is consistent with the emergence of an $L1_0$ phase in the thin film, which was not present prior to RTA processing.

To quantify the degree of $L1_0$ ordering, the $L1_0$ phase fraction can be calculated by integrating the region associated with the "hard" phase pre- and post-RTA processing. Since the total FORC distribution can be integrated to retrieve the total magnetization of the sample, it is possible to separately integrate the regions corresponding to each phase, and compare against the total magnetization to determine the approximate percentage of each phase present in the sample as a measure of the $L1_0$ ordering. Sample A showed that 88% of the magnetization was composed of the low-coercivity disordered phase, while sample D shows that 68% of the magnetization is composed of the high-coercivity ($L1_0$) phase, an increase by a factor of nearly 6. While this does not show 100% $L1_0$ ordering, it does demonstrate that the process can successfully induce a large degree of $L1_0$ ordering in FeNi thin films.

From the description herein, it will be appreciated that that the present disclosure encompasses multiple embodiments which include, but are not limited to, the following:

1. A method for synthesizing $L1_0$ FeNi thin films, the method comprising: (a) providing a target composite of a narrow band gap substrate with a wide band gap seed layer and multiple repeats of atomic layers of Fe and Ni coupled to the seed layer; (b) rapidly heating the target composite in a vacuum over a period of less than 3 seconds to a temperature of 800° C. or above; (c) maintaining the temperature of the heated target composite at 800° C. or above over a period of less than 10,000 seconds; and (d) cooling the heated target composite to ambient temperature and pressure over a period of less than 1000 seconds.

2. The method of any preceding embodiment, wherein the target composite is heated to a temperature of 800° C. or above in a time period of between one second to two seconds.

3. The method of any preceding embodiment, wherein the temperature of the heated target composite is maintained over a period of 60 seconds to 90 seconds.

4. The method of any preceding embodiment, wherein the heated target composite undergoes rapid cooling to ambient temperature in a period of less than two (2) seconds.

5. The method of any preceding embodiment, wherein the target composite further comprises a capping layer on a top surface of the bilayers to prevent oxidation.

6. The method of any preceding embodiment, wherein the capping layer comprises a layer of Fe.

7. The method of any preceding embodiment, wherein the substrate is a material selected from the group of materials consisting of Si, Ge, PbSe, PbS, InSb, $Bi_2Te_3$, alpha-Sn, SnTe, SnSe, and GaAs.

8. The method of any preceding embodiment, wherein the Si substrate of the target composite has a (100) orientation.

9. The method of any preceding embodiment, wherein the seed layer is a material selected from the group of materials consisting of $SiO_2$, MgO, $Al_2O_3$, $HfO_2$, and $Gd_2O_3$, and BN.

10. The method of any preceding embodiment, wherein the Fe and Ni atomic layers comprise a bilayer of an atomic layer of Fe and an atomic layer of Ni, regardless of the order, repeated 1000 times or less.

11. The method of any preceding embodiment, wherein the Fe and Ni atomic layers comprise a bilayer of an atomic layer of Fe and an atomic layer of Ni, regardless of the order, repeated 2 times to 30 times.

12. The method of any preceding embodiment, wherein the Fe and Ni bilayers have an atomic ratio of Fe to Ni within the range of 30:70 to 70:30.

13. The method of any preceding embodiment, wherein the Fe and Ni bilayers have an atomic ratio of Fe to Ni of 50:50.

14. A method for synthesizing a Tetrataenite ($L1_0$ FeNi) thin film, the method comprising: (a) forming a wide band gap seed layer on a narrow band gap substrate; (b) applying multiple repeats of atomic layers of Fe and Ni to the seed layer of the substrate to produce a target composite; (c) rapidly heating the target composite in a vacuum over a period of less than 3 seconds to a temperature of 800° C. or above; (d) maintaining the temperature of the heated target composite at 800° C. or above over a period of less than 10,000 seconds; and (e) cooling the heated target composite to ambient temperature and pressure over a period of less than 1000 seconds.

15. The method of any preceding embodiment, wherein the multiple repeats of atomic layers of Fe and Ni are applied to the seed layer of the substrate by magnetron sputtering in a vacuum chamber performed with the substrate held at a temperature of approximately 220° C.

16. The method of any preceding embodiment, wherein the Fe and Ni atomic layers comprise a bilayer of an atomic layer of Fe and an atomic layer of Ni, regardless of the order, repeated 1000 times or less.

17. The method of any preceding embodiment, wherein the Fe and Ni bilayers have an atomic ratio of Fe to Ni within the range of 30:70 to 70:30.

18. The method of any preceding embodiment, further comprising: applying a capping layer on a top surface of the atomic layers of Fe and Ni of the target composite to prevent oxidation.

19. The method of any preceding embodiment, wherein the capping layer comprises a layer of Fe.

20. The method of any preceding embodiment, wherein the substrate is a material selected from the group of materials consisting of Si, Ge, PbSe, PbS, InSb, $Bi_2Te_3$, alpha-Sn, SnTe, SnSe, and GaAs.

21. The method of any preceding embodiment, wherein the seed layer is a material selected from the group of materials consisting of $SiO_2$, MgO, $Al_2O_3$, $HfO_2$, and $Gd_2O_3$ and BN.

22. The method of any preceding embodiment, wherein the target composite is heated to a temperature of 800° C. or above in a time period of between one second to two seconds.

23. The method of any preceding embodiment, wherein the temperature of the heated target composite is maintained over a period of 60 seconds to 90 seconds.

24. The method of any preceding embodiment, wherein the heated target composite undergoes rapid cooling to ambient temperature in a period of less than two (2) seconds.

25. A target composite for use in synthesizing $L1_0$ FeNi thin films, comprising: (a) a narrow band gap substrate; (b) a wide band gap seed layer on a top surface of the narrow band gap substrate; (c) a plurality of bilayers of an atomic layer of Fe and an atomic layer of Ni, regardless of the order, repeated 1000 times or less, coupled to the seed layer; and (d) a capping layer on a top surface of the plurality of bilayers.

26. The composite of any preceding embodiment, wherein the capping layer comprises a layer of Fe.

27. The composite of any preceding embodiment, wherein the substrate is a material selected from the group of materials consisting of Si, Ge, PbSe, PbS, InSb, $Bi_2Te_3$, alpha-Sn, SnTe, SnSe, and GaAs.

28. The composite of any preceding embodiment, wherein the seed layer is a material selected from the group of materials consisting of $SiO_2$, MgO, $Al_2O_3$, $HfO_2$, and $Gd_2O_3$ and BN.

29. The composite of any preceding embodiment, wherein the Fe and Ni bilayers have an atomic ratio of Fe to Ni within the range of 30:70 to 70:30.

30. The composite of any preceding embodiment, wherein the Fe and Ni bilayers have an atomic ratio of Fe to Ni of 50:50.

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

In the claims, reference to an element in the singular is not intended to mean "one and only one" unless explicitly so stated, but rather "one or more." All structural, chemical, and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

What is claimed is:

1. A method for synthesizing L10 FeNi thin films, the method comprising:
    (a) providing a target composite of a narrow band gap substrate with a wide band gap seed layer and multiple repeats of atomic layers of Fe and Ni coupled to the seed layer;
    (b) rapidly heating the target composite in a vacuum over a period of less than 3 seconds to a temperature of 800° C. or above;
    (c) maintaining the temperature of the heated target composite at 800° C. or above over a period of less than 10,000 seconds; and
    (d) cooling the heated target composite to ambient temperature and pressure over a period of less than 1000 seconds.

2. The method of claim 1, wherein said target composite is heated to a temperature of 800° C. or above in a time period of between one second to two seconds.

3. The method of claim 1, wherein said temperature of the heated target composite is maintained over a period of 60 seconds to 90 seconds.

4. The method of claim 1, wherein said heated target composite undergoes rapid cooling to ambient temperature in a period of less than two (2) seconds.

5. The method of claim 1, wherein said Fe and Ni atomic layers comprise a bilayer of an atomic layer of Fe and an atomic layer of Ni, and wherein said target composite further comprises a capping layer on a top surface of said Fe and Ni bilayers to prevent oxidation.

6. The method of claim 5, wherein said capping layer comprises a layer of Fe.

7. The method of claim 1, wherein said substrate is a material selected from the group of materials consisting of Si, Ge, PbSe, PbS, InSb, $Bi_2Te_3$, alpha-Sn, SnTe, SnSe, and GaAs.

8. The method of claim 7, wherein said substrate of said target composite is Si with a (100) orientation.

9. The method of claim 1, wherein said seed layer is a material selected from the group of materials consisting of $SiO_2$, MgO, $Al_2O_3$, $HfO_2$, and $Gd_2O_3$, and BN.

10. The method of claim 1, wherein said Fe and Ni atomic layers comprise a bilayer of an atomic layer of Fe and an atomic layer of Ni, regardless of the order, repeated 1000 times or less.

11. The method of claim 10, wherein said Fe and Ni atomic layers comprise a bilayer of an atomic layer of Fe and an atomic layer of Ni, regardless of the order, repeated 2 times to 30 times.

12. The method of claim 11, wherein said bilayers of Fe and Ni have a ratio of Fe atoms to Ni atoms within the range of 30:70 to 70:30.

13. The method of claim 12, wherein said bilayers of Fe and Ni have a ratio of Fe atoms to Ni atoms of 50:50.

14. A method for synthesizing a Tetrataenite ($L1_0$ FeNi) thin film, the method comprising:
(a) forming a wide band gap seed layer on a narrow band gap substrate;
(b) applying multiple repeats of atomic layers of Fe and Ni to the seed layer of the substrate to produce a target composite;
(c) rapidly heating the target composite in a vacuum over a period of less than 3 seconds to a temperature of 800° C. or above;
(d) maintaining the temperature of the heated target composite at 800° C. or above over a period of less than 10,000 seconds; and
(e) cooling the heated target composite to ambient temperature and pressure over a period of less than 1000 seconds.

15. The method of claim 14, wherein said multiple repeats of atomic layers of Fe and Ni are applied to the seed layer of the substrate by magnetron sputtering in a vacuum chamber performed with the substrate held at a temperature of approximately 220° C.

16. The method of claim 14, wherein said Fe and Ni atomic layers comprise a bilayer of an atomic layer of Fe and an atomic layer of Ni, regardless of the order, repeated 1000 times or less.

17. The method of claim 16, wherein said bilayers of Fe and Ni have a ratio of Fe atoms to Ni atoms within the range of 30:70 to 70:30.

18. The method of claim 14, further comprising:
applying a capping layer on a top surface of said atomic layers of Fe and Ni of said target composite to prevent oxidation.

19. The method of claim 18, wherein said capping layer comprises a layer of Fe.

20. The method of claim 14, wherein said substrate is a material selected from the group of materials consisting of Si, Ge, PbSe, PbS, InSb, $Bi_2Te_3$, alpha-Sn, SnTe, SnSe, and GaAs.

21. The method of claim 14, wherein said seed layer is a material selected from the group of materials consisting of $SiO_2$, MgO, $Al_2O_3$, $HfO_2$, and $Gd_2O_3$ and BN.

22. The method of claim 14, wherein said target composite is heated to a temperature of 800° C. or above in a time period of between one second to two seconds.

23. The method of claim 14, wherein said temperature of the heated target composite is maintained over a period of 60 seconds to 90 seconds.

24. The method of claim 14, wherein said heated target composite undergoes rapid cooling to ambient temperature in a period of less than two (2) seconds.

* * * * *